United States Patent [19]

Wai et al.

[11] Patent Number: 5,351,167
[45] Date of Patent: Sep. 27, 1994

[54] SELF-LEADED SURFACE MOUNTED ROD INDUCTOR

[75] Inventors: Ka K. Wai; Aurelio J. Gutierrez, both of San Diego, Calif.

[73] Assignee: Pulse Engineering, Inc., San Diego, Calif.

[21] Appl. No.: 62,936

[22] Filed: May 17, 1993

Related U.S. Application Data

[63] Continuation-in-part of Ser. No. 825,148, Jan. 24, 1992, Pat. No. 5,212,345, and a continuation-in-part of Ser. No. 825,986, Jan. 27, 1992, Pat. No. 5,262,745.

[51] Int. Cl.⁵ .................. H05K 7/02; H01F 15/10
[52] U.S. Cl. .................. 361/760; 336/192; 361/767
[58] Field of Search .......... 336/192; 174/52.5; 361/760, 761, 763, 767, 770

[56] References Cited

U.S. PATENT DOCUMENTS

| | | | |
|---|---|---|---|
| 3,684,993 | 8/1972 | Hazan, III et al. | 336/136 |
| 4,086,553 | 4/1978 | Robandt et al. | 336/192 |
| 4,166,265 | 8/1979 | Reynolds et al. | 336/192 |
| 4,754,370 | 6/1988 | DeTizio et al. | 361/404 |
| 4,904,974 | 2/1990 | Tsuji | 335/296 |

FOREIGN PATENT DOCUMENTS

| | | | |
|---|---|---|---|
| 1815479 | 6/1970 | Fed. Rep. of Germany | 336/192 |
| 2229859 | 1/1974 | Fed. Rep. of Germany | 336/192 |
| 2236241 | 2/1974 | Fed. Rep. of Germany | 336/192 |
| 0077408 | 5/1985 | Japan | 336/192 |
| 0164307 | 8/1985 | Japan | 336/192 |
| 0047101 | 2/1987 | Japan | 336/192 |
| 62-122109 | 6/1987 | Japan | |
| 3014410 | 1/1988 | Japan | 336/192 |
| 63-287011 | 11/1988 | Japan | |
| 3-194908 | 8/1991 | Japan | |

OTHER PUBLICATIONS

Dickens (AT&T) Improved Coil Bobbin, Technical Digest, No. 76, Mar. 1985, pp. 19–20.

Primary Examiner—Leo P. Picard
Assistant Examiner—Bot Ledynh
Attorney, Agent, or Firm—Baker, Maxham, Jester & Meador

[57] ABSTRACT

An electronic component adapted for surface mounting on a PC board has an elongate bobbin made of a dielectric material. A coil of wire is wound about the winding support surface of the bobbin. The coil has a pair of lead terminations which are wrapped around a pair of T-shaped lead termination support members extending from the same side of the bobbin. When the bobbin rests on top of a PC board, the support members position the wrapped lead terminations slightly above solder pads.

17 Claims, 2 Drawing Sheets

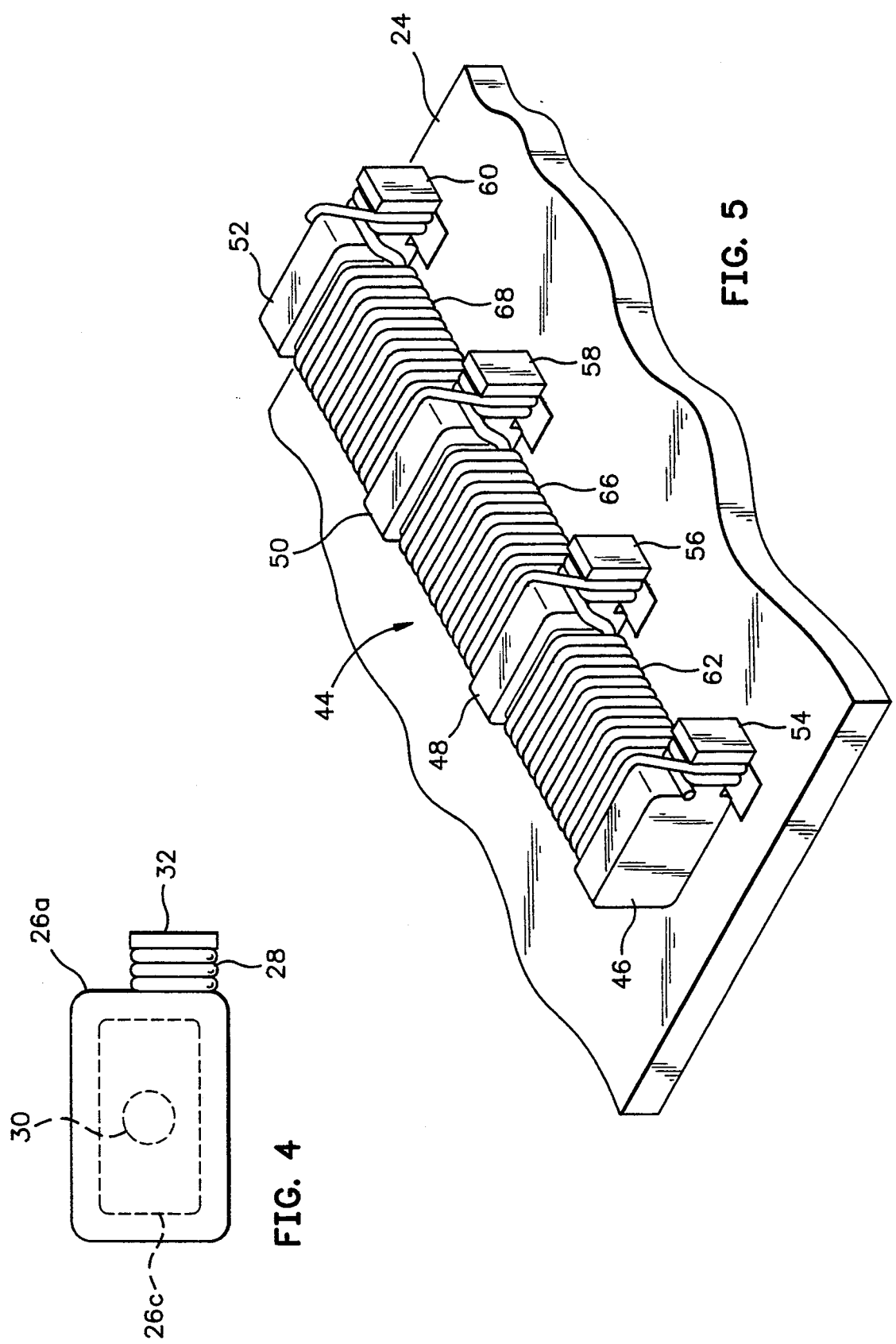

SELF-LEADED SURFACE MOUNTED ROD INDUCTOR

CROSS-REFERENCE TO RELATED APPLICATIONS

This application is a continuation-in-part of U.S. patent application Ser. No. 07/825,148 filed Jan. 24, 1992 which will issue on May 18, 1993 as U.S. Pat. No. 5,212,345 entitled SELF LEADED SURFACE MOUNTED COPLANAR HEADER. This application is also a continuation-in-part of allowed U.S. patent application Ser. No. 07/825,986 filed Jan. 27, 1992, now U.S. Pat. No. 5,262,745, entitled SURFACE MOUNTED MULTI-SECTION BOBBIN. Both of the aforesaid applications name Aurelio J. Gutierrez as the sole inventor. The disclosure of both of the aforesaid applications is specifically incorporated herein by reference.

BACKGROUND OF THE INVENTION

The present invention relates to electronic component packaging, and pertains particularly to a rod-shaped inductor especially adapted for surface mounting.

For many years, electronic circuit boards have been fabricated by interconnecting a plurality of electronic components, both active and passive, on a planar printed circuit board. For many years a conventional PC board has comprised an Epoxy/fiberglass laminate substrate clad with a sheet of copper, which has been etched to delineate the conductive paths. Holes have been drilled through terminal portions of the conductive paths for receiving electronic component leads, which were subsequently soldered thereto. As used herein the term "PC" board shall mean any insulative substrate on which has been formed one or more conductive traces or paths for supporting and interconnecting one or more electronic components.

More recently, so-called surface mount technology has evolved to permit more efficient automatic mass production of circuit boards with higher component densities. With this approach, certain packaged components are automatically placed at preselected locations on top of a PC board, so that their leads are registered with, and lie on top of corresponding solder paths or pads. The PC board is then processed by exposure to infrared or vapor phase soldering techniques to re-flow the solder and thereby establish a permanent electrical connection between the leads and their corresponding conductive paths on the PC board.

The increasing miniaturization of electrical and electronic elements and high density mounting thereof has created increasing problems with electrical isolation and mechanical interconnection. In particular, such miniaturization creates more difficulty establishing reliable and efficient connection between packaged components and egress hardware or terminals. Presently known interconnect methods severely limit the ability to provide density and reliable electrical and mechanical isolation between distinct egress or terminal points due to space limitations.

Among the electronic components that must be surface mounted on PC boards are multi-section bobbins. A bobbin is a small insulated (dielectric) spool which serves as a support for an inductive coil or wire wound resistor. The current technique of surface mounting a bobbin 10 to a PC board 12 is illustrated in FIG. 1. A pair of flying leads 14 and 16 made of wire extend from opposite ends of a coil 18 wrapped around the bobbin 10. It is difficult to control the length and height of these wire leads. The wire is usually very fine gauge, e.g. AWG 24 to AWG 50. The portion of the wires 14 and 16 next to the solder joints 18 and 20 are covered by the wick-up solder. Invariably this results in a brittle weak point. Movement of either the wire or the component can result in a broken wire or a micro-crack, causing a serious reliability problem. Flying leads leads are frequently broken as a result of thermal expansion and contraction of the leads and/or terminals.

The aforementioned U.S. patent application Ser. No. 07/825,986 discloses a surface mounted multi-section bobbin including an elongated support body. This body is constructed of a non-conducting material having a plurality of curved winding support areas bound on each side by a generally rectangular mounting member having recesses in opposed surfaces thereof. The bobbin further includes a combined mounting and lead terminal member having opposed gripping fingers engaging the recesses. One of the fingers has a free end extending outward therefrom for connecting with a lead wire. The base portion of the terminal member overlies a solder pad on the PC board.

It would desirable to provide an improved package and method of mounting of a multi-section bobbin without the necessity of fabricating and attaching a separate lead terminal member.

SUMMARY OF THE INVENTION

It is the primary object of the present invention to provide an improved package and method of mounting of a multi-section bobbin without the necessity of fabricating and attaching a separate lead terminal member.

The present invention provides an electronic component adapted for surface mounting on a PC board. The component has an elongate bobbin made of a dielectric material. A coil of wire is wound about the winding support surface of the bobbin. The coil has a pair of lead terminations which are wrapped around a pair of lead termination support members extending from the same side of the bobbin. When the bobbin rests on top of a PC board, the support members position the wrapped lead terminations slightly above solder pads. The coil may be made of conductive wire so that it provides a predetermined inductance. Alternatively, the coil may be made of a resistive wire so that it provides a predetermined resistance. The bobbin may have multiple winding support surfaces separated by shoulders, each supporting a coil having terminal ends wrapped around corresponding lead termination support members.

BRIEF DESCRIPTION OF THE DRAWINGS

The above and other objects and advantages of the present invention will become apparent from the following description when read in conjunction with the accompanying drawings wherein:

FIG. 4 is an enlarged side elevation view of the of the single-section rod inductor of FIGS. 2 and 3 showing construction details thereof; and FIG. 5 is an isometric view of a multi-section rod inductor fabricated in accordance with the present invention.

DESCRIPTION OF THE PREFERRED EMBODIMENTS

Figure 1:
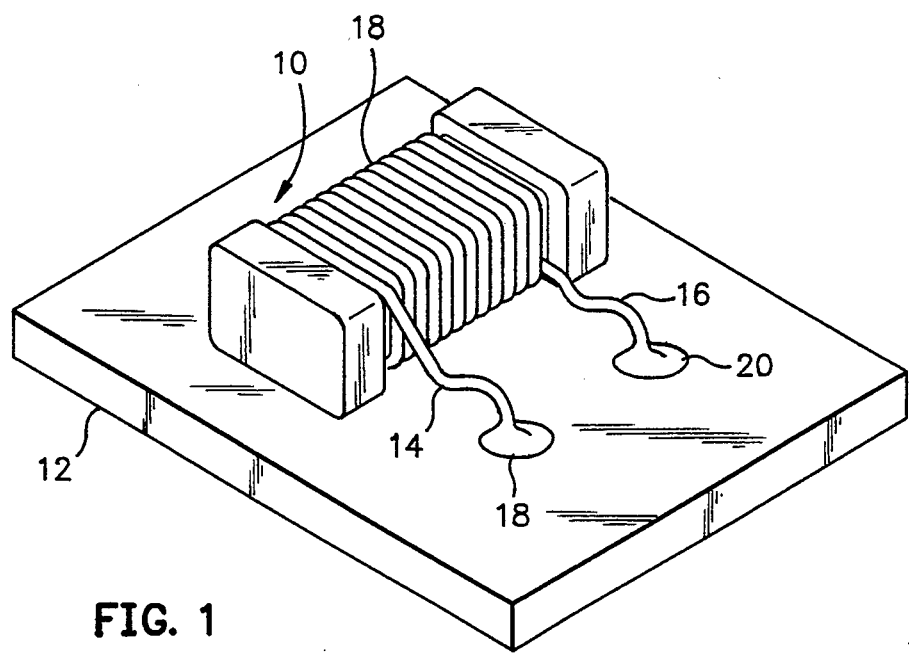
FIG. 1 is an isometric view illustrating a prior art rod inductor with flying leads which are soldered to a PC board.
Figure 2:
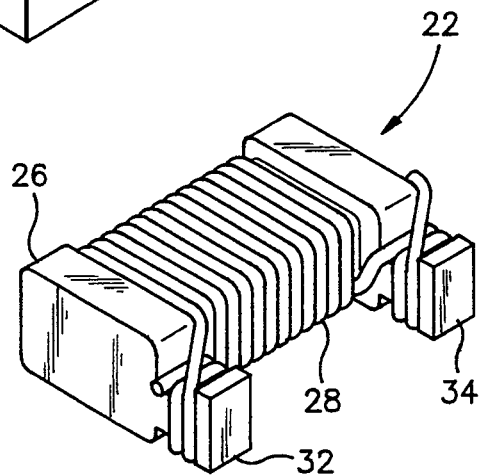
FIG. 2 is an isometric view of a single-section rod inductor fabricated in accordance with the present invention.
Figure 3:
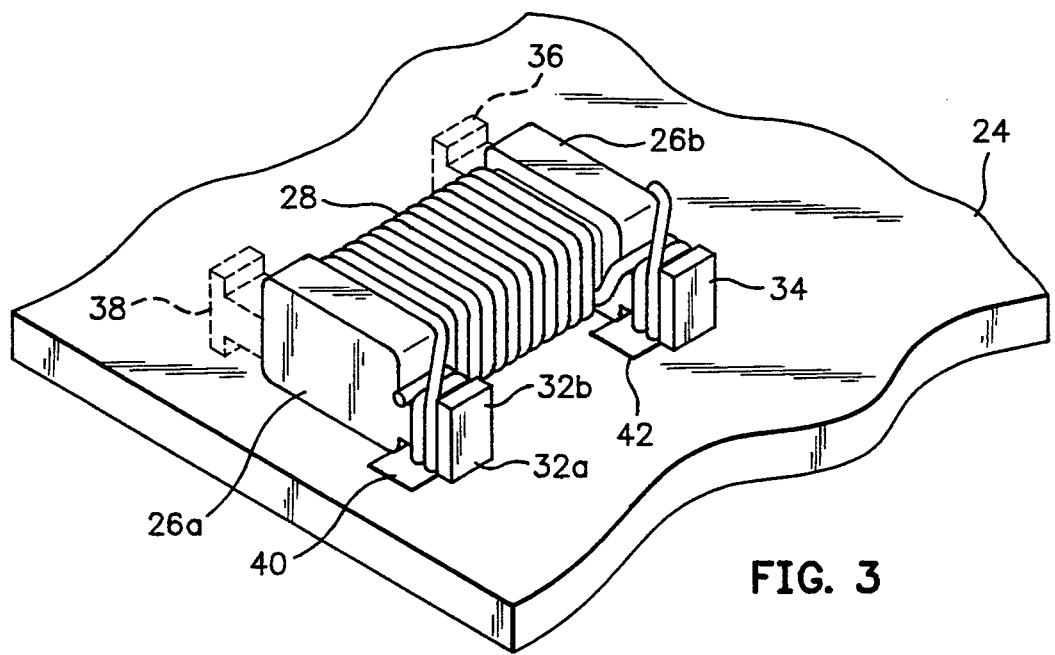
FIG. 3 is an isometric view of the of the single-section rod inductor of FIG. 2 surface mounted to a PC board which is shown broken away.

Turning to the drawings, and particularly FIGS. 2-4, there is illustrated a first embodiment of the present invention, designated generally by the numeral 22. The first embodiment 22 comprises a single section self-leaded surface mounted rod inductor for simple and easy surface mounting on a PC board 24. This device includes a specially constructed elongate bobbin 26 for supporting a coil of wire 28 which is wound around the bobbin. The wire may be conductive wire so that the coil forms and inductor of a desired value in micro-Henries. The bobbin 26 may include a co-axially extending core 30 (FIG. 4) made of a ferrous material in order to obtain substantially greater inductances. Alternatively, the wire 28 may be resistive wire in order for the coil to form a wire resistor of a desired ohm value.

The bobbin 26 comprises an elongated body constructed of a non-conductive material such as plastic. Preferably the bobbin 26 is made with thermal-plastic materials or thermal-set materials. The bobbin has a pair of end shoulders 26a and 26b, between which extends an intermediate winding support surface 26c. The wire coil 28 is wound about the intermediate winding support surface. The winding support surface may have any suitable cross-sectional configuration, such as rectangular, cylindrical, oval, elliptical, or any other suitable configuration. The rectangular and oval configurations may be preferred for some applications, because they have a lower profile for a given winding. The shoulders 26a and 26b of the bobbin 26 have lower services lying in a common plane defining a sitting plane serve as a mounting means for engaging the PC board 24 and supporting the intermediate winding support above the surface of the PC board 24.

The bobbin 26 is further formed with a pair of lead termination support members 32 and 34 which extend outwardly from opposite sides of the bobbin. These lead termination support members each have a T-shaped configuration, with opposed upper and lower vertically extending wire retaining flanges such as 32a and 32b (FIG. 3). A lead from one end of the wire coil 28 extends to and terminates as a winding of preferably up to about three turns on a corresponding one of the termination support members. It will be understood that where only a single wire is wrapped into a coil around the winding support surface 28, the bobbin is formed with only two lead termination support members, namely 32 and 34, which extend laterally from the same side of the bobbin 26. Where a pair of wire coils are wound about the intermediate winding support of the bobbin 26, the bobbin 26 is formed with two additional lead termination support members 36 and 38 (shown in phantom lines in FIG. 3) which extend laterally from the opposite side of the bobbin 26.

The lead termination support members 32, 34, 36 and 38 support the termination of the wire leads in a position to be soldered to corresponding conductive traces or pads such as 40 and 42 on the PC board 24. The wire leads are preferably tinned by wave soldering or dip soldering. As shown in FIG. 4, the support members such as 32 are positioned and dimensioned to that each tinned termination of the wire leads such as 28a is slightly above the surface of the PC board 24 or conductive pad 40 that it is to be bonded to. This clearance is preferably between about 0.001 and 0.003 inches to facilitate subsequent bonding of the lead termination 28a to the pad 40 via solder reflow. The shoulders 26a and 26b of the bobbin 26 actually engage the surface of the PC board. The pad 40 on the PC board 24 can be pre-treated with solder paste, with a layer of about eight to ten thousandths of an inch in thickness.

In assembling the rod inductor 22, the bobbin 26 is first molded of a suitable plastic material. Next, a suitable number of wire windings, either one or two, are wrapped around the bobbin 26 between the shoulders 26a and 26b. This wrapping is preferably performed on an automatic winding machine so that the turns will be uniformly spaced. The terminal ends of each of the windings are extended to and wrapped around selected pairs of the terminal support members such as 32 and 34. The entire device may then be coated with a dielectric conformal coating material, such as epoxy. The terminal members are then dipped in a solder hot enough to melt the insulation therefrom and tin coat the terminal leads. The device can later be placed in an appropriate position on the PC board 24, with the lead terminals disposed over solder pads 40 and 42 which have been pre-treated with a solder paste, and are bonded in place by reflow. This construction eliminates the need for lead frames and terminals pins. It is also simple, easy and inexpensive to construct.

FIG. 5 illustrates a second embodiment 44 our inventions which comprises a multi-section self-leaded surface mounted rod inductor for simple and easy surface mounting on the PC board 24. It is similar in all respects to the first embodiment 22 except that its bobbin has multiple wire supporting surfaces each bounded by shoulders 46, 48, 50 and 52 each formed with lead termination members 54, 56, 58 and 60, respectively. This device supports three separate wire coils 62, 66 and 68. It may be provided with an internal ferrous core (not illustrated) where higher inductance values are desired.

While we have illustrated and described our invention by means of specific embodiments, it should be understood that numerous changes and modifications may be made therein without departing from the spirit and scope of the invention as defined in the appended claims. The protection afforded our invention should only be limited in accordance with these claims.

We claim:

1. An electronic component adapted for surface mounting, comprising:
   an elongated bobbin made of a dielectric material and having a winding support surface, a pair of shoulders at opposite ends of the winding support surface, the shoulders having lower co-planar surfaces defining a sitting plane and for supporting the bobbin on a surface of a PC board;
   a coil of wire wound about the winding support surface of the bobbin and having a pair of lead terminations; and
   a pair of lead termination support members each extending from the bobbin and one of the lead terminations wrapped therearound, the support members positioning the wrapped lead terminations about 0.001 to about 0.003 inches above the sitting plane.

2. An electronic component according to claim 1 wherein the wrapped lead terminations are tinned.

3. An electronic component according to claim 1 wherein the lead termination support members have a T-shaped configuration.

4. An electronic component according to claim 1 and further comprising a core made of a ferrous material.

5. An electronic component according to claim 1 wherein the wire is made of a conductive material so that the coil provides a predetermined inductance.

6. An electronic component according to claim 1 wherein the wire is made of a resistive material so that the coil provides a predetermined resistance.

7. An electronic component according to claim 1 wherein the bobbin has a rectangular cross-section.

8. An electronic component according to claim 1 wherein the lead termination support members extend from opposite sides of the bobbin.

9. An electronic component according to claim 1 wherein the bobbin and coil are coated with a conformal dielectric coating material.

10. An electronic component adapted for surface mounting, comprising:

an elongated bobbin made of a dielectric material and having a winding support surface, a spool configuration with peripheral shoulders at opposite ends of the support surface, the shoulders having lower surfaces disposed in a common sitting plane and adapted to support the bobbin on a surface of a PC board;

a coil of wire wound about the winding support surface of the bobbin and having a pair of lead terminations; and a pair of lead termination support members each extending from a shoulder of the bobbin and one of the lead terminations wrapped around each of the termination support members, the support members positioning the wrapped lead terminations at about 0.001 to about 0.003 inches above the sitting plane.

11. An electronic component according to claim 10 wherein the lead termination support members each extend from a side of a shoulder and have a T-shaped configuration with vertically extending arms.

12. An electronic component according to claim 11 wherein the wrapped lead terminations are tinned.

13. An electronic component according to claim 12 and further comprising a core made of a ferrous material.

14. An electronic component according to claim 13 wherein the wire is made of a conductive material so that the coil provides a predetermined inductance.

15. An electronic component according to claim 13 wherein the wire is made of a resistive material so that the coil provides a predetermined resistance.

16. An electronic component according to claim 13 wherein the bobbin has a rectangular cross-section.

17. An electronic component according to claim 16 wherein the bobbin and coil are coated with a conformal dielectric coating material.

* * * * *